United States Patent
Daghan et al.

(10) Patent No.: US 7,333,005 B2
(45) Date of Patent: Feb. 19, 2008

(54) SYSTEM AND METHOD FOR DATA COMMUNICATION WITH A CONTROL DEVICE HAVING AN ADAPTER FOR REFLASHING CONTROL DEVICE SOFTWARE

(75) Inventors: Aytac Daghan, Regensburg (DE); Franz Plattner, Arnschwang (DE)

(73) Assignee: Siemens Aktiengesellschaft, Munich (DE)

( * ) Notice: Subject to any disclaimer, the term of this patent is extended or adjusted under 35 U.S.C. 154(b) by 142 days.

(21) Appl. No.: 11/254,047

(22) Filed: Oct. 19, 2005

(65) Prior Publication Data

US 2006/0082447 A1  Apr. 20, 2006

(30) Foreign Application Priority Data

Oct. 19, 2004 (DE) .................. 10 2004 050 882

(51) Int. Cl.
*B60R 25/10* (2006.01)

(52) U.S. Cl. .................. 340/426.3; 340/426.1; 340/426.36; 340/5.2; 340/5.72; 307/10.5

(58) Field of Classification Search ............. 340/426.3, 340/426.36, 426.1
See application file for complete search history.

(56) References Cited

U.S. PATENT DOCUMENTS

| 5,959,540 | A | * | 9/1999 | Walter ...................... 340/5.64 |
| 5,983,347 | A | * | 11/1999 | Brinkmeyer et al. ....... 340/5.62 |
| 6,662,087 | B1 | | 12/2003 | Liebl et al. ................... 701/29 |
| 7,148,790 | B2 | * | 12/2006 | Aoyama et al. ......... 340/425.5 |

FOREIGN PATENT DOCUMENTS

| DE | 196 12 026 A1 | 10/1997 |
| DE | 103 21 118 A1 | 11/2004 |
| DE | 10 2004 023 182 A1 | 12/2004 |
| EP | 1 002 705 A2 | 5/2000 |

* cited by examiner

*Primary Examiner*—Donnie L. Crosland
(74) *Attorney, Agent, or Firm*—Laurence A. Greenberg; Werner H. Stemer; Ralph E. Locher

(57) ABSTRACT

A system and a method for data communication with a vehicle control device include a flash adapter which is inserted with a vehicle key into an ignition lock of a vehicle. Upon insertion into the ignition lock, the vehicle key is authenticated. Subsequently, a comparison between the control device data stored in the key and the vehicle can be triggered by using the flash adapter.

13 Claims, 2 Drawing Sheets

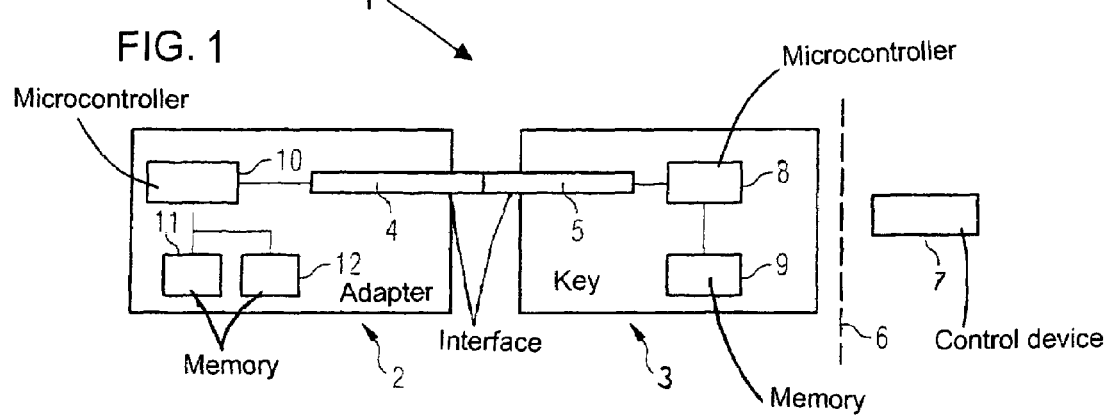
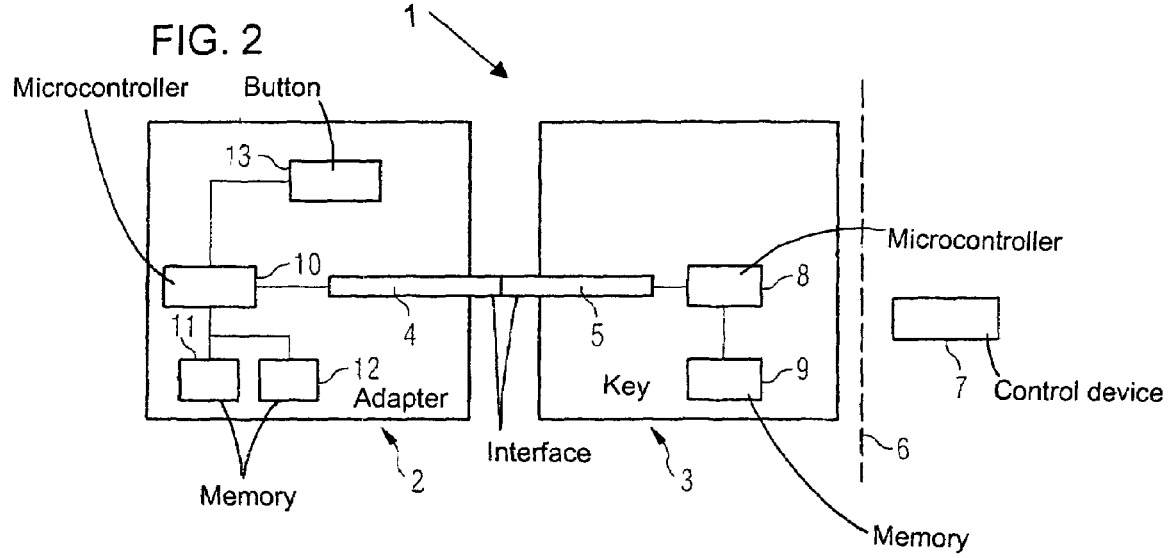

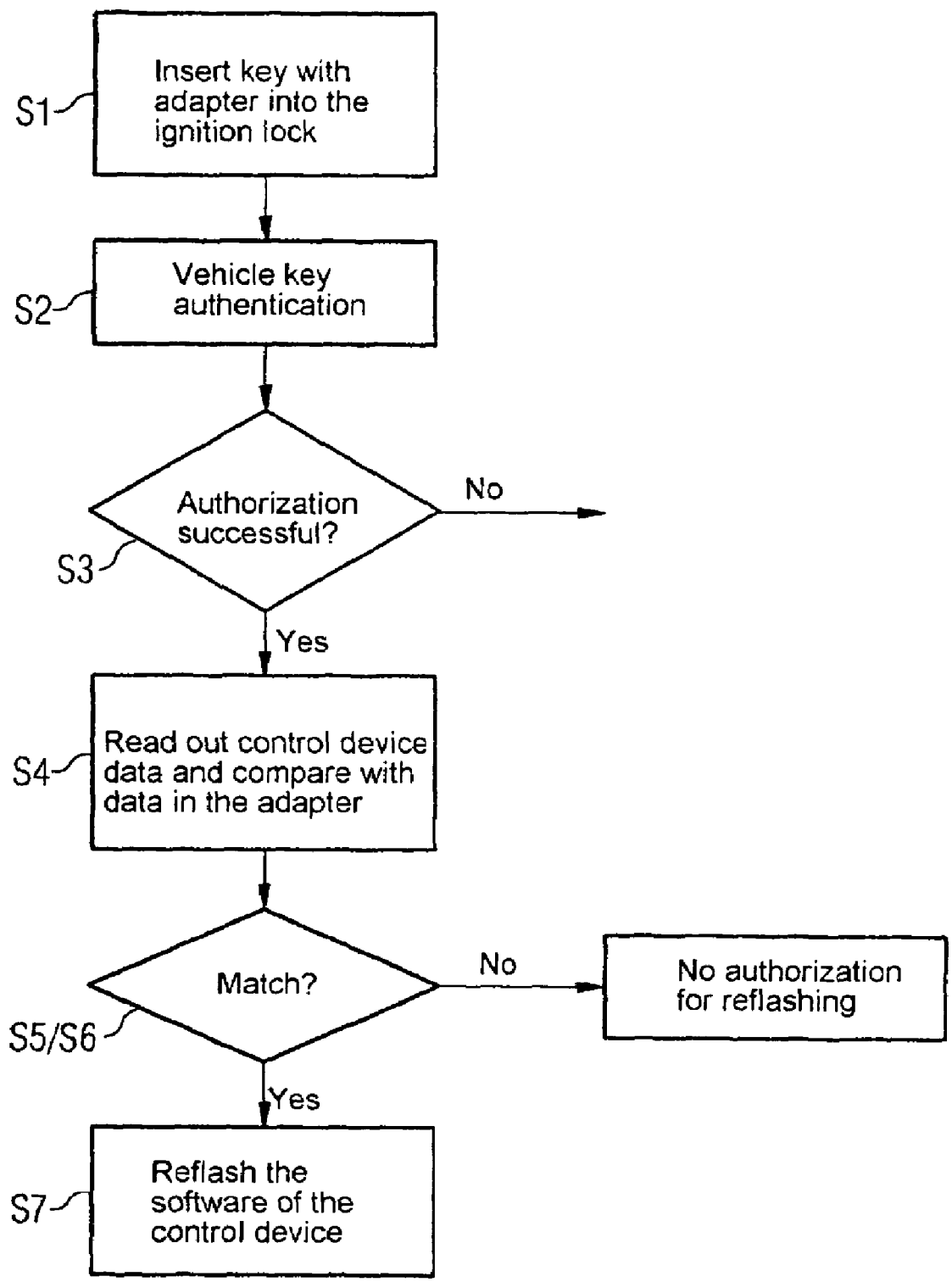

SYSTEM AND METHOD FOR DATA COMMUNICATION WITH A CONTROL DEVICE HAVING AN ADAPTER FOR REFLASHING CONTROL DEVICE SOFTWARE

BACKGROUND OF THE INVENTION

Field of the Invention

The invention relates to a system and a method for data communication with a control device, in particular a system and a method for subsequently modifying data (reflashing) in a control device of a motor vehicle.

In order, for example, to remedy failures or bugs in control device software or to release additional control device functions subsequently (after a vehicle has been delivered), the vehicle must be taken to a workshop and the control device of the vehicle must be accessed using a diagnostic device. In that case it is not possible to restrict the authorized user group for reflashing. For example, it is not possible to equip only a particular individual vehicle with new functions.

SUMMARY OF THE INVENTION

It is accordingly an object of the invention to provide a system and a method for data communication with a control device having an adapter for reflashing control device software, which overcome the hereinafore-mentioned disadvantages of the heretofore-known systems and methods of this general type and in which an authorized user group for subsequently modifying data in a control device can be chosen selectively.

With the foregoing and other objects in view there is provided, in accordance with the invention, a system for data communication with a control device. The system comprises a vehicle access device. An adapter is to be coupled to the vehicle access device. An interface transmits authentication data between the vehicle access device and the control device. The adapter communicates with the control device, upon the adapter being coupled to the vehicle access device and upon authentication of the vehicle access device.

With the objects of the invention in view, there is also provided a method for data communication with a control device. The method comprises coupling a vehicle access device, connected to an adapter, to a control device. The vehicle access device is authenticated. Data is transmitted between the adapter and the control device upon correct authentication of the vehicle access device.

According to a preferred embodiment of the invention, a system contains an adapter, for example a flash adapter, which can be electrically coupled to a vehicle key. This vehicle key is then inserted together with the coupled flash adapter into an ignition lock of a vehicle. The vehicle key is authenticated when it is inserted into the ignition lock. It is only if the authentication is correct, that data can be transmitted between the adapter and the control device.

In particular, the adapter receives information from the control device which is characteristic of a vehicle, for example the chassis number or chronological data specific to the vehicle.

A microcontroller contained in the adapter receives this information and compares it to information stored previously in the adapter. It is only if there is a match that the adapter sends data to the control device. This data can, for example, cause additional functions in the control device to be released, or update the software of the control device.

It is possible to individualize the reflash procedure by coupling the reflash procedure to authentication of the vehicle key. The reflashing or functional upgrade can be restricted to an authorized user group by individualization.

According to another development of the invention, hardware upgrades are provided in the vehicle key adapter. The hardware upgrade in the adapter is, for example, a transmitter with a greater range and/or an additional button.

An adapter of this type can, for example, be used for a remote engine start or remote operation of the air-conditioning system used in combination with the vehicle key. As a result, no separate chronological individualization of the adapter is necessary.

Other features which are considered to be characteristic for the invention are set forth in the claims that are appended hereto.

Although the invention is illustrated and described herein as embodied in a system and a method for data communication with a control device having an adapter for reflashing control device software, it is nevertheless not intended to be limited to the details shown and described, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a system in accordance with a first embodiment of the invention;

FIG. 2 is a block diagram of a system in accordance with a second embodiment of the invention; and FIG. 3 is a flow diagram illustrating a method implemented by the system according to FIG. 1.

DESCRIPTION OF THE PREFERRED EMBODIMENTS

Referring now to the figures of the drawings in detail and first, particularly, to FIG. 1 thereof, there is seen a block diagram of a system 1 in accordance with a first preferred embodiment of the invention.

The system 1 contains an adapter 2, which can be linked to a vehicle key 3. The vehicle key 3 is a vehicle access device which, for example, can also be configured as an IC card.

The adapter 2 contains an interface 4 through which the adapter 2 can be connected to a corresponding interface 5 of the vehicle key 3.

According to the embodiment shown in FIG. 1, the interface 4 of the adapter 2 and the interface 5 of the key 3 are constructed as plug-in connections. Alternatively, an infrared connection, a connection through SUB, a serial or inductive connection, etc. is possible.

As is shown in FIG. 1, the adapter 2 is inserted into an ignition lock 6 together with the vehicle key 3, in order to permit data communication with a vehicle-mounted control device 7.

Data communication between the control device 7 and the vehicle key 3 is controlled by a microcontroller 8. The vehicle key 3 further contains a memory 9 in which, for example, information is stored enabling authentication of the vehicle key 3 upon insertion into the ignition lock 6.

As is shown in FIG. 1, the adapter 2 also contains a microcontroller 10, which is connected to a first memory 11 and a second memory 12.

Information is stored in the first memory 11 which, for example, is a ROM or EEPROM. That information is required for reflashing the software of the control device 7. The stored information can, for example, release or deactivate particular additional functions of the control device 7. The second memory 12 contained in the adapter 2 which, for example, is a ROM or EEPROM, preferably stores information characteristic of an individual vehicle.

FIG. 2 shows a block diagram of a system according to a second preferred embodiment of the invention. The second embodiment differs from the first embodiment only in that the adapter 2 contains an additional button 13. This enables a hardware upgrade to be provided in the adapter.

FIG. 3 shows a flow-chart clarifying the functioning of the system according to the first embodiment of FIG. 1.

In a step S1, the key 3 together with an attached adapter 2 is inserted into the ignition lock 6.

In a step S2, the vehicle key 3 is authenticated. In this case, authentication data stored in the memory 9 of the vehicle key 3 is compared to authentication data in the control device 7 by the microcontroller 8.

In a step Se, the microcontroller 8 determines whether or not the vehicle key has been authenticated. If it has not, the flow-chart terminates at step Se.

If the vehicle key 3 has been successfully authenticated, data communication is enabled between the adapter 2 and the control device 7. In particular, in a step S4, data stored in the control device is read out by the microcontroller 10 and compared to data contained in the second memory 12 of the adapter 2. For example, a chassis number of the vehicle stored in the control device 7 is read out by the microcontroller 10 of the adapter 2 and compared to a predetermined list of chassis numbers stored in the second memory 12. The list of chassis numbers stored in the second memory 12 represents an authorized user group of individual vehicles which can be reflashed with the adapter 2 and the corresponding vehicle keys. A step S5. determines whether or not the chassis number read out from the control device 7 is contained in the list stored in the second memory 12 of the adapter 2. If it is not, the flow-chart is terminated at a step S6, with no reflashing of the control device software being performed.

If it is ascertained in step S5 that authorization for reflashing is resent, in other words that the read-out chassis number is contained in the list stored in the second memory 12, in a step S7 the data contained in the first memory 11 of the adapter 2 is transmitted to the control device 7.

This data can, for example, release particular additional functions of the control device 7. Alternatively, it is further possible for the microcontroller 10 to additionally read out a version number of the current software in the control device 7, and to check whether or not a more recent software version is available for reflashing in the memory 11 of the adapter 2.

Although in the foregoing, preferred embodiments of the invention have been described with reference to the attached drawings, it is clear that modifications and changes can be made without exceeding the scope of the invention, providing it is ensured that, through authentication of the vehicle key, the authorization to reflash an individual vehicle is examined.

This application claims the priority, under 35 U.S.C. § 119, of German Patent Application 10 2004 050 882.8, filed Oct. 19, 2004; the entire disclosure of the prior application is herewith incorporated by reference.

We claim:

1. A system for data communication with a control device, the system comprising:
   a vehicle access device;
   an adapter to be coupled to said vehicle access device; and
   an interface for transmitting authentication data between said vehicle access device and the control device;
   said adapter communicating with the control device, upon said adapter being coupled to the vehicle access device and upon authentication of the vehicle access device.

2. The system according to claim 1, wherein said adapter has a microcontroller and a memory storing data for changing a function of the control device.

3. The system according to claim 2, wherein said microcontroller transmits the data to the control device if control device information received by the microcontroller matches predetermined information stored in said adapter.

4. The system according to claim 3, wherein the data effects an activation or a deactivation of additional functions of the control device.

5. The system according to claim 3, wherein the data contains a software update of the control device.

6. The system according to claim 1, wherein said adapter has at least one component for making a hardware upgrade available.

7. The system according to claim 6, wherein said component is at least one of an additional button or a transmitter/receiver.

8. The system according to claim 1, wherein said vehicle access device is a vehicle key, and said interface is an ignition lock.

9. A method for data communication with a control device, which comprises the following steps:
   coupling a vehicle access device, connected to an adapter, to a control device;
   authenticating the vehicle access device; and
   transmitting data between the adapter and the control device upon correct authentication of the vehicle access device.

10. The method according to claim 9, which further comprises transmitting data from the adapter to the control device only if information received from the control device matches predetermined information stored in the adapter.

11. The method according to claim 10, which further comprises activating or deactivating additional functions of the control device with data transmitted from the adapter to the control device.

12. The method according to claim 10, wherein data transmitted from the adapter to the control device contains a software update of control device software.

13. The method according to claim 11, wherein data transmitted from the adapter to the control device contains a software update of control device software.

* * * * *